United States Patent [19]
Hadjichristos et al.

[11] Patent Number: 6,078,219
[45] Date of Patent: Jun. 20, 2000

[54] WIDE RANGE SINGLE STAGE VARIABLE GAIN AMPLIFIER

[75] Inventors: Aristotele Hadjichristos, Apex; Scott R. Justice, Durham, both of N.C.

[73] Assignee: Ericsson Inc., Research Triangle Park, N.C.

[21] Appl. No.: 09/181,361

[22] Filed: Oct. 28, 1998

[51] Int. Cl.[7] ........................................ H03F 3/45
[52] U.S. Cl. ........................... 330/254; 330/284; 327/359
[58] Field of Search ................................ 330/254, 284; 327/359

[56] References Cited

U.S. PATENT DOCUMENTS

| | | | |
|---|---|---|---|
| 3,909,738 | 9/1975 | Niimi | 330/30 |
| 5,477,191 | 12/1995 | Demicheli | 330/254 |
| 5,767,727 | 6/1998 | Kimura | 327/359 |
| 5,896,063 | 4/1999 | Marsh et al. | 330/254 |

*Primary Examiner*—Robert Pascal
*Assistant Examiner*—Henry Choe
*Attorney, Agent, or Firm*—Wood, Phillips, VanSanten, Clark & Mortimer

[57] ABSTRACT

A wide range single stage variable gain amplifier is provided for receiving an input signal and outputting an amplitude varied version of the received input signal. In its most basic form, the wide range single stage variable gain amplifier includes an input circuit receiving an input signal and developing an input current, a first control circuit receiving the input current, the first control circuit being selectively controllable to output an attenuated version of the received input current, a second control circuit directly connected to the first control circuit for receiving the attenuated input current therefrom, the second control circuit being selectively controllable to output a further attenuated version of the attenuated input current, and an output circuit receiving the further attenuated input current and developing an amplitude varied version of the received input signal.

25 Claims, 2 Drawing Sheets

WIDE RANGE SINGLE STAGE VARIABLE GAIN AMPLIFIER

FIELD OF THE INVENTION

The present invention is directed toward variable gain amplifiers and, more particularly, toward a wide range, single stage variable gain amplifier.

BACKGROUND OF THE INVENTION

Variable Gain Amplifiers (VGAs) are well known in the art. VGAs are generally used when the magnitude of a signal, such as an electrical current or voltage, is required to be increased or decreased. The range of gain control of a VGA is essentially defined as the difference between maximum and minimum gain. For example, if the maximum gain is +10 dB (magnification) and the minimum gain is −40 dB (attenuation), the range of gain control is 50 dB. It is understood that the maximum gain in a VGA may actually be an attenuation of the input signal.

In today's hand-held cellular digital radios, there is a need to control the transmitted power over a very wide control range. For IS-95 radio systems, the required control range can exceed 100 dB. Typically, two or more VGAs are cascaded in a transmitter line-up in order to achieve higher control ranges.

The use of multiple, or multistage as they are commonly known, VGAs has various drawbacks, such as excessive current consumption and poor noise performance. Since each VGA generally requires its own DC bias current, cascading two, three, or more VGAs will require an increase in supply current. This becomes a problem in small size, high talk time cellular phones since a large battery will be required to supply the increased supply current. Further, since each VGA stage generates noise, increasing the number of stages effectively increases the amount of noise, resulting in degraded performance.

The present invention is directed toward overcoming one or more of the above-mentioned problems.

SUMMARY OF THE INVENTION

A wide range single stage variable gain amplifier is provided for receiving an input signal and outputting an amplitude varied version of the received input signal. In its most basic form, the wide range single stage variable gain amplifier includes an input circuit receiving an input signal and developing an input current, a first control circuit receiving the input current, the first control circuit being selectively controllable to output an attenuated version of the received input current, a second control circuit directly connected to the first control circuit for receiving the attenuated input current therefrom, the second control circuit being selectively controllable to output a further attenuated version of the attenuated input current, and an output circuit receiving the further attenuated input current and developing an amplitude varied version of the received input signal.

The first control circuit includes a first switching circuit and a first pass circuit, both being selectively controllable to switch a portion of the input current through the first switching circuit. The portion of the input current flowing through the first pass circuit is output as the attenuated version of the input current. Similarly, the second control circuit includes a second switching circuit and a second pass circuit, both being selectively controllable to switch a portion of the attenuated input current, received from the first pass circuit, through the second switching circuit. The portion of the attenuated input current flowing through the second pass circuit is output as the further attenuated version of the attenuated input current.

The first pass circuit generally includes first and second transistors, each having input, output and control elements. The first switching circuit generally includes third and fourth transistors, each having input, output and control elements. The input current is received at the output elements of the first through fourth transistors. The control elements of the first and second transistors receive a first control voltage controlling current flow therethrough. Similarly, the control elements of the third and fourth transistors receive a second control voltage controlling current flow therethrough.

The second pass circuit generally includes fifth and sixth transistors, each having input, output and control elements. The second switching circuit generally includes seventh and eighth transistors, each having input, output and control elements. The attenuated input current is received from the first pass circuit at the output elements of the fifth through eighth transistors. The control elements of the fifth and sixth transistors receive a third control voltage controlling current flow therethrough. Similarly, the control elements of the seventh and eighth transistors receive a fourth control voltage controlling current flow therethrough.

A DC voltage source is provided and develops a DC bias current flowing through the first through eighth transistors. The transistors may include Bipolar Junction Transistors (BJTs), Field Effect Transistors (MOSFETs or MESFETs), or Heterojunction Bipolar Transistors (HBTs).

In a preferred form, the first and second transistors are equally sized, the third and fourth transistors are equally sized, the fifth and sixth transistors are equally sized, and the seventh and eighth transistors are equally sized. However, the transistor pairs do not need to be sized the same.

The output circuit generally includes first and second impedances off of which the amplitude varied version of the input signal is taken. The first and second impedances may include resistors or inductors, which themselves may have additional circuitry connected thereto.

It is an object of the present invention to provide a VGA having a wide control range and requiring minimum supply current.

It is a further object of the present invention to decrease the amount of noise introduced into a VGA having a wide control range.

It is yet a further object of the present invention to decrease the number of necessary stages in a VGA having a wide control range.

Other aspects, objects and advantages of the present invention can be obtained from a study of the application, the drawings, and the appended claims.

DETAILED DESCRIPTION OF THE PREFERRED EMBODIMENT

Figure 1:
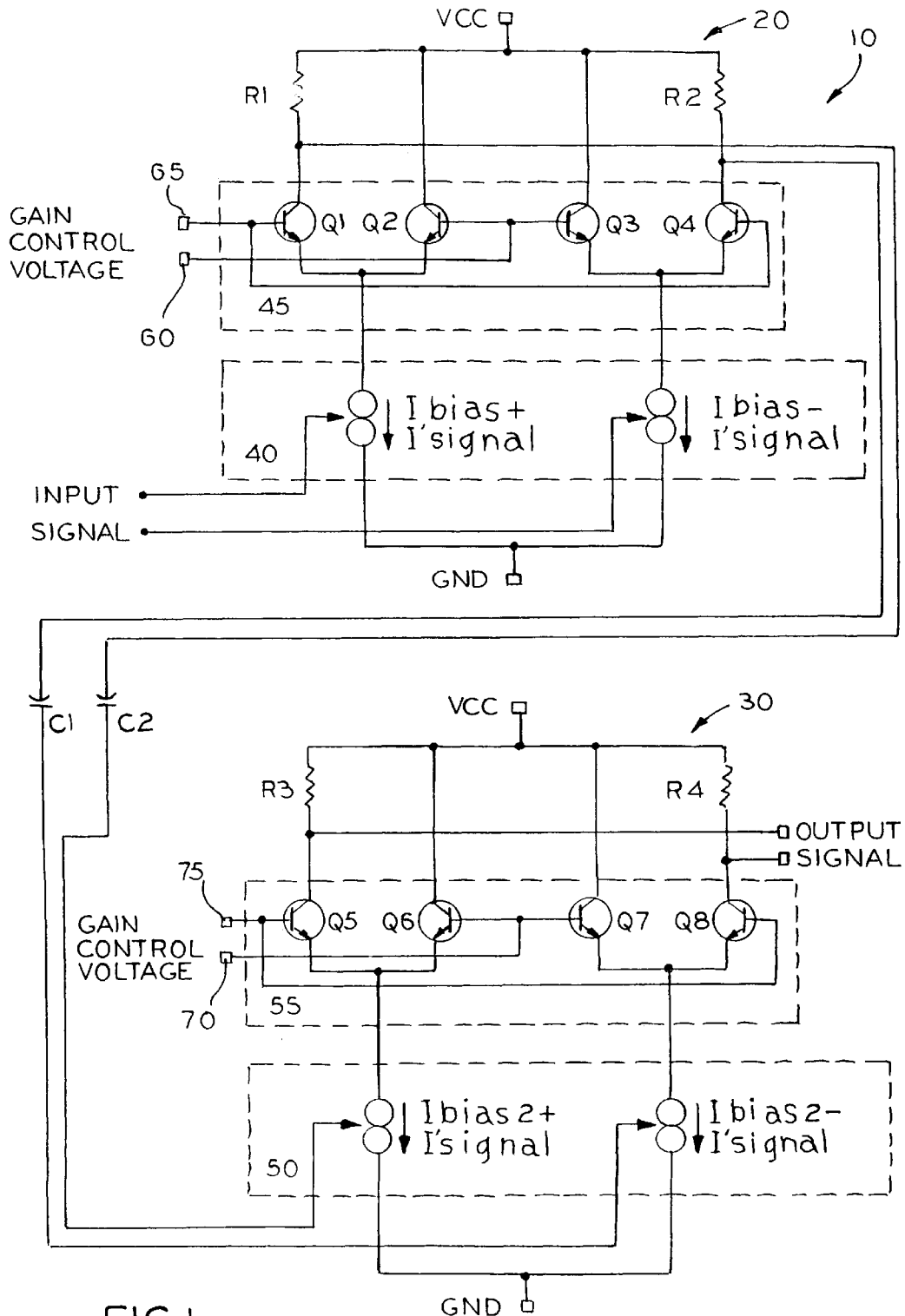
FIG. 1 is a circuit diagram of a prior art two-stage VGA.

FIG. 1 illustrates a prior art two-stage VGA shown generally at 10. The two-stage VGA 10 includes first and second VGA stages 20 and 30, respectively. The first VGA stage 20 includes an input stage 40 receiving the input signal and a current switching stage 45. Similarly, the second VGA stage 30 includes an input stage 50 and a current switching stage 55.

The current switching stage 45 includes bipolar junction transistors Q1, Q2, Q3 and Q4. The collectors of transistors Q2 and Q3 are connected directly to a DC voltage source $V_{CC}$. The collectors of transistors Q1 and Q4 are connected to the voltage source $V_{CC}$ through resistors R1 and R2, respectively.

The input stage 40 receives an AC input signal and conventionally converts the input signal, if necessary, to an input current $I_{signal}$. The input current $I_{signal}$ is superimposed on an oppositely flowing DC bias current $I_{bias}$ which flows from $V_{CC}$ to ground through resistors R1,R2 and transistors Q1, Q2, Q3, Q4, dynamically changing the bias current $I_{bias}$. Since the DC bias current $I_{bias}$ will generally remain constant on average, its effect on the input current $I_{signal}$ can be neglected in the following discussion.

The input current $I_{signal}$ is received by the current switching stage 45 at the emitters of transistors Q1, Q2, Q3 and Q4. A first gain control voltage is applied, at pin 60, to the base elements of transistors Q2 and Q3, and similarly, a second gain control voltage is applied, at pin 65, to the base elements of transistors Q1 and Q4. The gain control voltages applied at pins 60 and 65 control the amount of input current $I_{signal}$ permitted to flow through transistors Q1, Q2, Q3 and Q4. Some or all of the input current $I_{signal}$ may be switched to flow through transistors Q2 and Q3 to $V_{CC}$, which is essentially an AC ground. The portion of the input current $I_{signal}$ which flows through transistors Q1 and Q4 is taken as a voltage off of resistors R1 and R2 and applied to the input stage 50 of the second VGA stage 30 through DC block capacitors C1 and C2 which block the DC components of the signal.

The current switching stage 55 of the second VGA stage 30 includes transistors Q5, Q6, Q7 and Q8. The collectors of transistors Q6 and Q7 are connected directly to $V_{CC}$. The collectors of transistors Q5 and Q8 are connected to $V_{CC}$ through resistors R3 and R4, respectively.

The input stage 50 receives the signal from the first VGA stage 20 and conventionally converts the signal to an input current $I_{signal}$. The input current $I_{signal}$ is superimposed on a DC bias current $I_{bias2}$ which flows from $V_{CC}$ to ground through resistors R3,R4 and transistors Q5, Q6, Q7, Q8, dynamically changing the bias current $I_{bias2}$. Since the DC bias current $I_{bias2}$ will generally remain constant on average, its effect on the input current $I_{signal}$ can be neglected in the following discussion.

The input current is received by the current switching stage 55 at the emitters of transistors Q5, Q6, Q7 and Q8. A third gain control voltage is applied, at pin 70, to the base elements of transistors Q6 and Q7, and similarly, a fourth gain control voltage is applied, at pin 75, to the base elements of transistors Q5 and Q8. The gain control voltages applied at pins 70 and 75 control the amount of input current $I_{signal}$ permitted to flow through transistors Q5, Q6, Q7 and Q8. Some or all of the input current $I_{signal}$ may be switched to flow through transistors Q6 and Q7 to $V_{CC}$, which is essentially an AC ground. The portion of the input current $i_{signal}$ which flows through transistors Q5 and Q8 is taken as a voltage off of resistors R3 and R4 and represents an amplitude varied version of the primary input signal. If more gain control is required, additional stages can be added.

As previously noted, the multistage VGA 10 of FIG. 1 requires excessive bias current ($I_{bias}$ and $I_{bias2}$) and has poor noise performance since noise will effectively be introduced into the multistage VGA 10 at each of the input stages 40 and 50.

Figure 2:
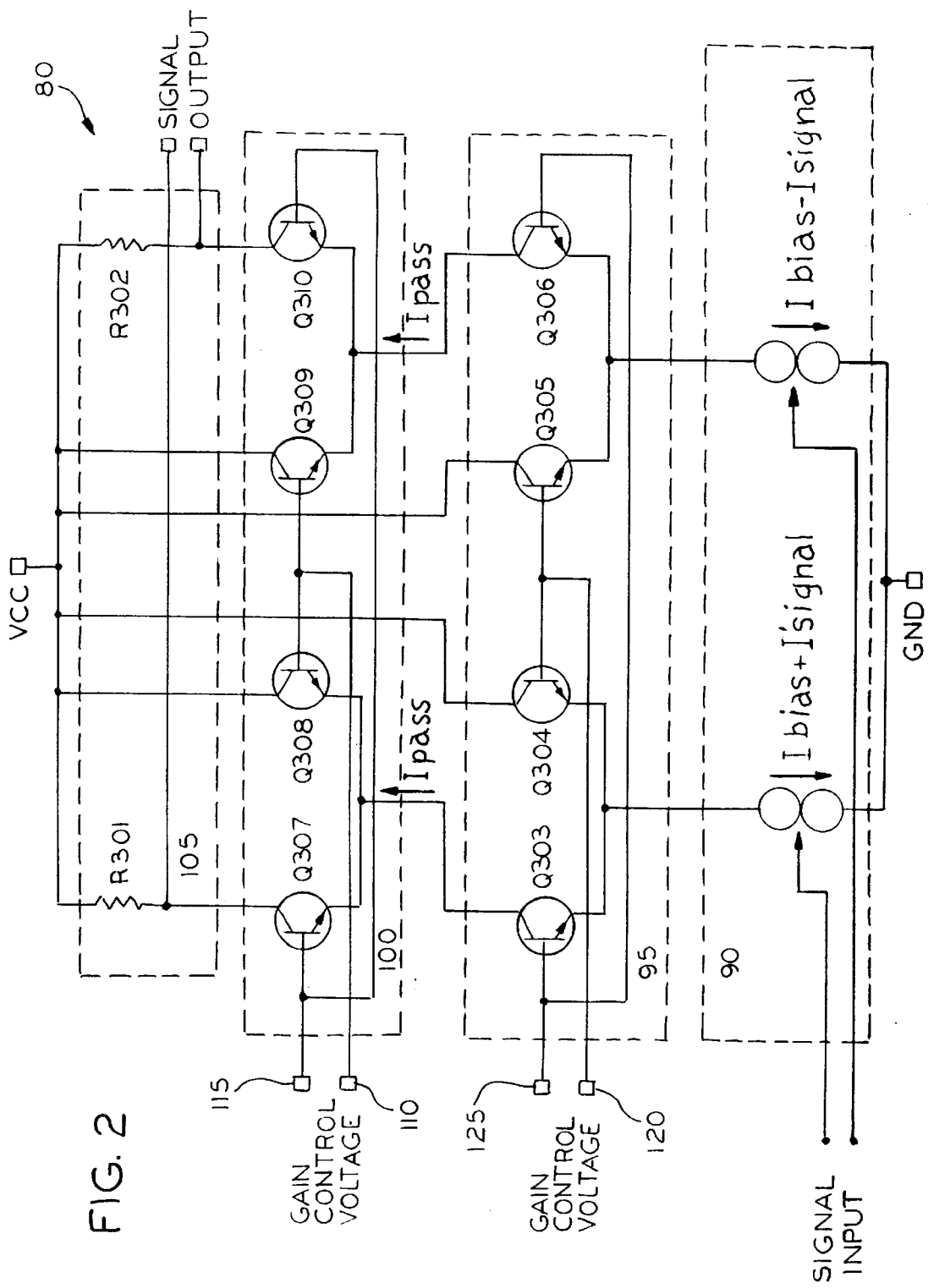
FIG. 2 is a circuit diagram of a wide control range single stage VGA according to the present invention.

FIG. 2 illustrates a wide control range, single stage VGA, shown generally at 80, according to the present invention. The VGA 80 includes an input circuit 90, a first gain control circuit 95, a second gain control circuit 100 and an output circuit 105.

The first gain control circuit 95 includes a first pass circuit including transistors Q303 and Q306 and a first switching circuit including transistors Q304 and Q305. Similarly, the second control circuit 100 includes a second pass circuit including transistors Q307 and Q310, and a second switching circuit including transistors Q308 and Q309. The output circuit 105 includes resistors R301 and R302, off of which the output signal is taken.

The collector elements of transistors Q304, Q305, Q308 and Q309 are connected directly to a DC voltage source $V_{CC}$. The collector elements of transistors Q307 and Q310 are connected to $V_{CC}$ through the output circuit 105, namely, resistors R301 and R302, respectively. The collector elements of transistors Q303 and Q306 are connected to the emitter elements of transistor pairs Q307/Q308 and Q309/Q310, respectively. The base elements of transistors Q308 and Q309 (the second switching circuit) are connected to gain control voltage pin 110. The base elements of transistors Q307 and Q310 (the second pass circuit) are connected to gain control voltage pin 115. The base elements of transistors Q304 and Q305 (the first switching circuit) are connected to gain control voltage pin 120. The base elements of transistors Q303 and Q306 (the first pass circuit) are connected to gain control voltage pin 125.

An input signal is received at the input stage 90. The input stage 90 conventionally converts the input signal, if necessary, to an input current $I_{signal}$. The input stage 90 may be a current to current input stage, a voltage to current input stage, a transconductor cell, etc. Further, the input current $I_{signal}$ developed by the input stage 90 may be a magnified or attenuated version of the signal input to the input stage 90.

The input current $I_{signal}$ is superimposed on a DC bias current $I_{bias}$ flowing from $V_{CC}$ to ground through transistors Q303, Q304, Q305, Q306, Q307, Q308, Q309, Q310, and resistors R301, R302, dynamically changing the bias current $I_{bias}$. Since the DC bias current $I_{bias}$ will generally remain constant on average, its effect on the input current $I_{signal}$ can be neglected in the following discussion.

The input current $I_{signal}$ is received by the first gain control circuit 95 at the emitter elements of transistors Q303, Q304, Q305 and Q306. Depending upon the gain control voltages applied at gain control voltage pins 120 and 125, which are applied to the base elements of transistor pairs Q304/Q305 and Q303/Q306, respectively, the input current $I_{signal}$, or portions thereof, will either flow through transistor pairs Q304/Q305 or Q303/Q306. For example, if the gain control voltage at pin 125 is greater than the gain control voltage at pin 120, more of the input current $I_{signal}$ will flow through transistor pair Q303/Q306 than through transistor pair Q304/Q305. A maximum gain situation would be where all of the input current $I_{singal}$ flows through transistors Q303 and Q306, while a minimum gain situation would be where all of the input current $I_{signal}$ flows through transistors Q304 and Q305 to $V_{CC}$, which is essentially an AC ground. The amount of input current $I_{signal}$ that flows through transistor pairs Q303/Q306 and Q304/Q305 is controllable by conventionally varying the gain control voltages applied at gain control voltage pins 125 and 120.

The portion of the input current $I_{signal}$ denoted in FIG. 2 as $I_{pass}$, flowing through transistors Q303 and Q306 is received by the second gain control circuit 100 at the emitter elements of transistor pairs Q307/Q308 and Q309/Q310, respectively. Depending upon the gain control voltages applied at gain control voltage pins 110 and 115, which are applied to the base elements of transistor pairs Q308/Q309 and Q307/Q310, respectively, the current $I_{pass}$, or portions thereof, will either flow through transistor pairs Q308/Q309 or Q307/Q310. For example, if the gain control voltage applied at pin 115 is greater than the gain control voltage applied at pin 110, more of the current $I_{pass}$ will flow through transistor pair Q307/Q310 than through transistor pair Q308/Q309. A maximum gain situation would be where all of the current $I_{pass}$ flows through transistors Q307 and Q310, while a minimum gain situation would be where all of the current $I_{pass}$ flows through transistors Q308 and Q309 to $V_{CC}$, which is essentially an AC ground. The amount of current $I_{pass}$ that flows through transistor pairs Q307/Q310 and Q308/Q309 is controllable by conventionally varying the gain control voltages applied at gain control voltage pins 115 and 110.

The portion of the current $I_{pass}$ flowing through resistors Q307 and Q310 is received by the output circuit 105 at resistors R301 and R302. The output signal is taken off of resistors R301 and R302 at the collector elements of transistors Q307 and Q310, respectively. The output signal may be either a voltage or current, depending upon circuit implementation, and represents an amplitude varied version of the primary input signal. It should be noted that other types of impedance elements which allow a DC current to flow therethrough, such as inductors (discrete or integrated), could be utilized in place of resistors R301 and R302. The impedance elements or resistors themselves may have additional circuitry connected thereto.

The novel VGA 80 reduces the amount of bias current necessary for operation, since the first and second gain control circuits 95 and 100 share the same DC bias current $i_{bias}$. The novel VGA 80 is particularly useful in small size, high talk time cellular phones where battery size is a concern. Further, by reducing the number of VGA stages needed for wide range gain control, the novel VGA 80 also reduces the amount of noise affecting the input signal.

In a preferred embodiment, current should flow symmetrically through the novel VGA 80. That is, equal amounts of current should flow through transistors Q304/Q305, Q303/Q306, Q307/Q310 and Q308/Q309, however, the current through each of the transistor pairs does not necessarily need to be equal. Further, for symmetry reasons, typically transistors Q303 and Q306 are equally sized, transistors Q304 and Q305 are equally sized, transistors Q308 and Q309 are equally sized, and transistors Q307 and Q310 are equally sized. However, the transistor pairs do not need to be sized the same.

Further, while the VGA 80 is shown in FIG. 2 as including BJTs (Bipolar Junction Transistors), essentially any type of transistor may be implemented without departing from the spirit and scope of the present invention. These include, but are not limited to MOSFETs (Metal Oxide Semiconductor Field Effect Transistors), MESFETs (Metal Semiconductor Field Effect Transistors) and HBTs (Heterojunction Bipolar Transistors).

The novel VGA 80 essentially achieves the same amount of gain control as a prior art 2-stage VGA 10 shown in FIG. 1, with a reduction in required DC bias current, noise and chip capacity. If further gain control is required from the novel VGA 80, various options exist. More gain control circuits (third, fourth, fifth, etc.) may be added to the novel VGA 80 between the second gain control circuit 100 and the output stage 105. Alternatively, the signal output from the novel VGA 80 may be applied to a prior art VGA stage, such as the first and second VGA stages 20 and 30 shown in FIG. 1, through conventional DC block capacitors.

While the invention has been described with particular reference to the drawings, it should be understood that various modifications could be made without departing from the spirit and scope of the present invention.

We claim:

1. A wide range single stage variable gain amplifier for receiving an input signal and outputting an amplitude varied version of the received input signal, said wide range single stage variable gain amplifier comprising:

an input circuit receiving an input signal and developing an input current;

a first control circuit including a first switching circuit and a first pass circuit receiving the input current and selectively controllable to output an attenuated version of the input current;

a second control circuit including a second switching circuit and a second pass circuit directly connected to the first control circuit receiving the attenuated input current, said second control circuit selectively controllable in response to a variable gain control input to output a further attenuated version of the attenuated input circuit, an attenuation amount of the further attenuated version being variable as determined by the variable gain control input; and an output circuit receiving the further attenuated input current and developing an amplitude varied version of the received input signal.

2. A wide range single stage variable gain amplifier for receiving an input signal and outputting an amplitude varied version of the received input signal, said wide range single stage variable gain amplifier comprising:

an input circuit receiving an input signal and developing an input current;

a first control circuit including a first switching circuit and a first pass circuit, both selectively controllable to switch a portion of the input current through the first switching circuit, said first pass circuit outputting an attenuated version of the input current;

a second control circuit directly connected to the first control circuit receiving the attenuated input current including a second switching circuit and a second pass circuit, both selectively controllable to switch a portion of the attenuated input current received from the first pass circuit through the second switching circuit, said second pass circuit outputting a further attenuated version of the attenuated input current; and an output circuit receiving the further attenuated input current and developing an amplitude varied version of the received input signal.

3. The wide range single stage variable gain amplifier of claim 2, wherein said first pass circuit includes first and second transistors each having input, output and control elements, said first switching circuit includes third and fourth transistors each having input, output and control elements, the control elements of the first and second transistors receiving a first control voltage controlling current flow therethrough, and the control elements of the third and fourth transistors receiving a second control voltage controlling current flow therethrough.

4. The wide range single stage variable gain amplifier of claim 3, wherein the first through fourth transistors comprise bipolar junction transistors having collector, emitter and base elements corresponding to the input, output and control elements, respectively.

5. The wide range single stage variable gain amplifier of claim 3, further including a DC voltage source developing a DC bias current flowing through the first through fourth transistors.

6. The wide range single stage variable gain amplifier of claim 3, wherein the input current is received at the output elements of the first through fourth transistors.

7. The wide range single stage variable gain amplifier of claim 3, wherein the first through fourth transistors comprise field effect transistors having drain, source and gate elements corresponding to the input, output and control elements, respectively.

8. The wide range single stage variable gain amplifier of claim 2, wherein said second pass circuit includes fifth and sixth transistors each having input, output and control elements, said second switching circuit includes seventh and eighth transistors each having input, output and control elements, the control elements of the fifth and sixth transistors receiving a third control voltage controlling current flow therethrough, and the control elements of the seventh and eight transistors receiving a fourth control voltage controlling current flow therethrough.

9. The wide range single stage variable gain amplifier of claim 8, wherein the fifth through eighth transistors comprise bipolar junction transistors having collector, emitter and base elements corresponding to the input, output and control elements, respectively.

10. The wide range single stage variable gain amplifier of claim 8, further including a DC voltage source developing a DC bias current flowing through the fifth through eighth transistors.

11. The wide range single stage variable gain amplifier of claim 8, wherein the attenuated input current is received at the output elements of the fifth through eighth transistors.

12. The wide range single stage variable gain amplifier of claim 8, wherein the fifth through eighth transistors comprise field effect transistors having drain, source and gate elements corresponding to the input, output and control elements, respectively.

13. The wide range single stage variable gain amplifier of claim 3, wherein the first and second transistors are equally sized, and the third and fourth transistors are equally sized.

14. The wide range single stage variable gain amplifier of claim 8, wherein the fifth and sixth transistors are equally size, and the seventh and eighth transistors are equally sized.

15. The wide range single stage variable gain amplifier of claim 1 wherein the output circuit comprises first and second impedances.

16. The wide range single stage variable gain amplifier of claim 15, wherein the first and second impedances comprise at least one of resistors and inductors.

17. A wide range single stage variable gain amplifier for receiving an input signal and outputting an amplitude varied version of the received input signal, said wide range single stage variable gain amplifier comprising:

an input circuit receiving an input signal and developing an input current;

a first control circuit including a first switching circuit and a first pass circuit, said first control circuit receiving the input current and selectively controllable to route some, all or none of the input current through the first switching circuit, said first pass circuit outputting an attenuated input current;

a second control circuit connected directly to the first pass circuit and including a second switching circuit and a second pass circuit, said second control circuit receiving the attenuated input current and selectively controllable to route some, all or none of the attenuated input current through the second switching circuit, said second pass circuit outputting a further attenuated input current; and an output circuit receiving the further attenuated input current and developing an amplitude varied version of the received input signal.

18. The wide range single stage variable gain amplifier of claim 17, wherein said first pass circuit includes first and second transistors each having input, output and control elements, said first switching circuit includes third and fourth transistors each having input, output and control elements, the output elements of the first through fourth transistors receiving the input current from the input circuit, the control elements of the first and second transistors receiving a first control voltage controlling current flow therethrough, and the control elements of the third and fourth transistors receiving a second control voltage controlling current flow therethrough.

19. The wide range single stage variable gain amplifier of claim 18, wherein said second pass circuit includes fifth and sixth transistors each having input, output and control elements, said second switching circuit includes seventh and eighth transistors each having input, output and control elements, the output elements of the fifth through eighth transistors receiving the attenuated input current from the input elements of the first and second transistors, the control elements of the fifth and sixth transistors receiving a third control voltage controlling current flow therethrough, the control elements of the seventh and eighth transistors receiving a fourth control voltage controlling current flow therethrough, and said output circuit receiving the further attenuated input current from the input elements of the fifth and sixth transistors.

20. The wide range single stage variable gain amplifier of claim 19, wherein the first through eighth transistors comprise bipolar junction transistors having collector, emitter and base elements corresponding to the input, output and control elements, respectively.

21. The wide range single stage variable gain amplifier of claim 19, wherein the first through eighth transistors comprise field effect transistors having drain, source and gate elements corresponding to the input, output and control elements, respectively.

22. The wide range single stage variable gain amplifier of claim 19, further including a DC voltage source developing a DC bias current flowing through the first through eighth transistors.

23. The wide range single stage variable gain amplifier of claim 19, wherein the first and second transistors are equally sized, the third and fourth transistors are equally sized, the fifth and sixth transistors are equally sized, and the seventh and eighth transistors are equally sized.

24. The wide range single stage variable gain amplifier of claim 17, wherein the output circuit comprises first and second impedances.

25. The wide range single stage variable gain amplifier of claim 24, wherein the first and second impedances comprise at least one of resistors and inductors.

* * * * *